United States Patent
Hartmann et al.

(10) Patent No.: US 9,872,405 B2
(45) Date of Patent: Jan. 16, 2018

(54) ELECTRONICS HOUSING AND MANUFACTURING METHOD

(71) Applicant: Brose Fahrzeugteile GmbH & Co. KG, Bamberg, Bamberg (DE)

(72) Inventors: Johannes Hartmann, Nuremberg (DE); Thomas Schindler, Grossheirath (DE); Ann-Cathrin Macht, Ebensfeld (DE)

(73) Assignee: Brose Fahrzeugteile GMBH & Co. KG, Bamberg, Bamberg (DE)

( * ) Notice: Subject to any disclaimer, the term of this patent is extended or adjusted under 35 U.S.C. 154(b) by 0 days.

(21) Appl. No.: 15/285,303

(22) Filed: Oct. 4, 2016

(65) Prior Publication Data
US 2017/0112007 A1    Apr. 20, 2017

(30) Foreign Application Priority Data
Oct. 15, 2015   (DE) .......................... 10 2015 220 080

(51) Int. Cl.
*H05K 5/00* (2006.01)
*H05K 5/02* (2006.01)

(52) U.S. Cl.
CPC .................................. *H05K 5/0217* (2013.01)

(58) Field of Classification Search
CPC   H02G 3/08; H02G 3/081; H05K 5/00; H05K 5/0004; H05K 5/0095; H05K 5/02; H05K 5/0217; H05K 5/0247; H02K 5/00; H02K 5/02; H02K 2205/09; H02K 5/10; H02K 5/04; H02K 7/1166
USPC ............... 174/50, 520, 17 R, 50.5, 559, 564; 310/88, 89; 215/261, 200; 220/373, 200; 277/637, 628, 590
See application file for complete search history.

(56) References Cited

U.S. PATENT DOCUMENTS

| | | | | |
|---|---|---|---|---|
| 4,794,942 A * | 1/1989 | Yasuda | ................. | F16H 57/027 222/209 |
| 5,215,312 A | 6/1993 | Knappe et al. | | |
| 6,056,439 A * | 5/2000 | Graham | ............... | B65D 77/225 220/89.1 |
| 7,626,129 B2 * | 12/2009 | Sasaki | .................. | H05K 5/0213 174/520 |
| 8,292,109 B2 * | 10/2012 | Lauk | .................... | H05K 5/0213 220/89.1 |

(Continued)

FOREIGN PATENT DOCUMENTS

| DE | 3716912 A1 | 12/1988 |
|---|---|---|
| DE | 8911042.0 U1 | 8/1990 |

(Continued)

*Primary Examiner* — Angel R Estrada
(74) *Attorney, Agent, or Firm* — Lewis Roca Rothgerber Christie LLP

(57) ABSTRACT

An electronics housing for the accommodation of at least one electronic component in an interior space defined by the electronics housing and at least partly enclosed by an exterior wall of the electronics housing is provided. The electronics housing exhibiting at least one pressure-equalizing element which enables an equalization of pressure between the interior space and an exterior space surrounding the electronics housing. The pressure-equalizing element is constituted by a gas-permeable wall portion of the exterior wall, on which the exterior wall exhibits a pore structure as a result of local foaming of the material from which the exterior wall has been produced.

17 Claims, 2 Drawing Sheets

(56) References Cited

U.S. PATENT DOCUMENTS

| | | | |
|---|---|---|---|
| 8,356,520 B2 * | 1/2013 | Hurst | H02K 5/08 |
| | | | 73/708 |
| 2008/0280126 A1 | 11/2008 | Lenz et al. | |
| 2013/0154413 A1 | 6/2013 | Schweichart et al. | |

FOREIGN PATENT DOCUMENTS

| | | |
|---|---|---|
| DE | 19962888 A1 | 6/2001 |
| DE | 10325819 A1 | 1/2005 |
| DE | 10 2009 038531 A1 | 3/2011 |
| DE | 10 2011 121716 B3 | 2/2013 |
| EP | 1165301 B1 | 2/2004 |
| EP | 1111228 B1 | 11/2004 |
| EP | 1133222 B1 | 8/2005 |
| EP | 0985511 B1 | 9/2005 |
| EP | 1162051 B1 | 8/2006 |
| EP | 1919992 B1 | 2/2010 |

\* cited by examiner

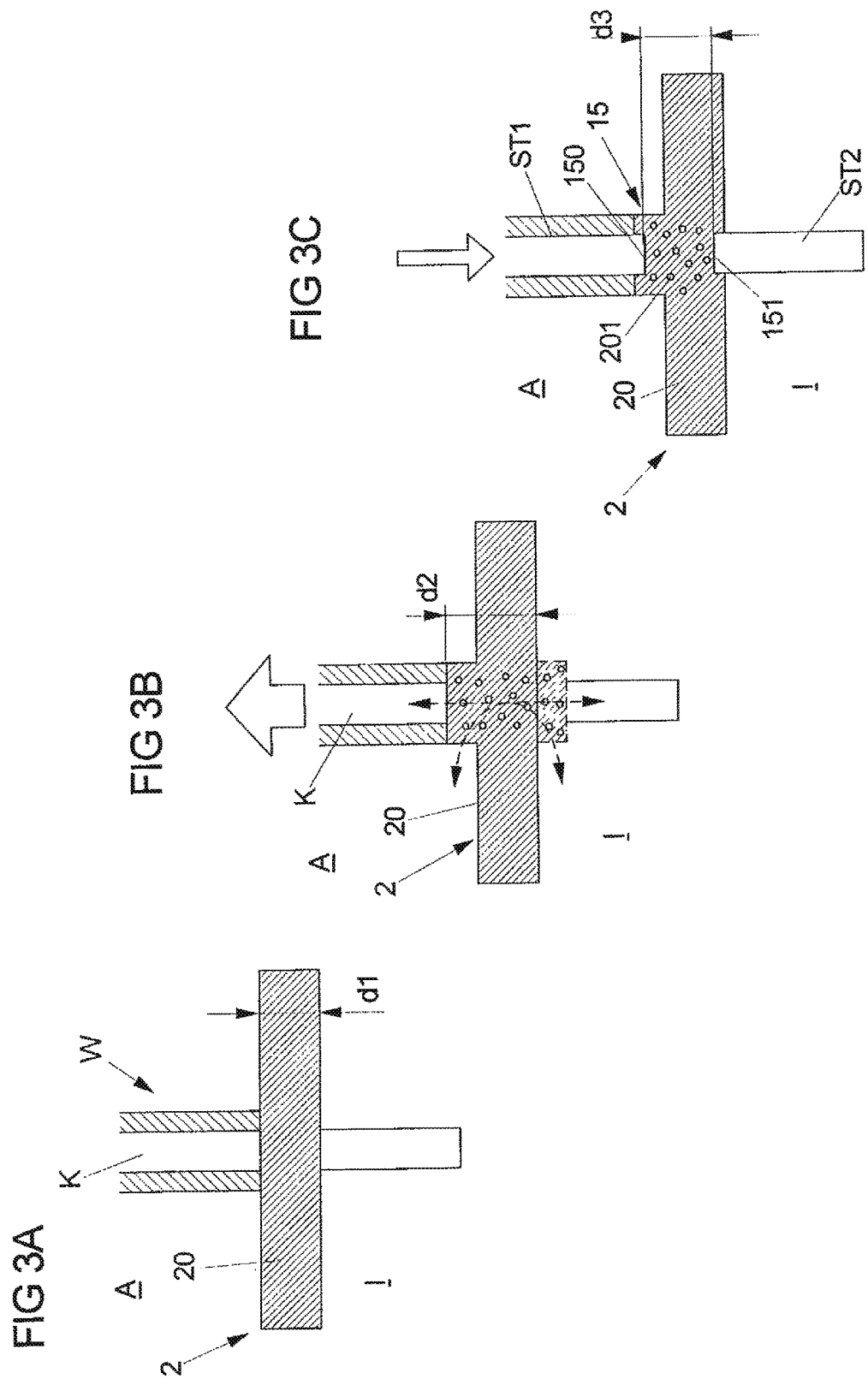

ELECTRONICS HOUSING AND MANUFACTURING METHOD

CROSS-REFERENCE TO RELATED APPLICATION

This Application claims priority to and the benefit of German Application No. 10 2015 220 080.9, filed Oct. 15, 2015, the entire content of which is incorporated herein by reference.

BACKGROUND

The present invention relates to an electronics housing and also to a method for producing an electronics housing.

A generic electronics housing is configured and provided for the accommodation of at least one electronic component in an interior space defined by the electronics housing. In this connection, the electronics housing exhibits at least one pressure-equalizing element which enables an equalization of pressure between the interior and the exterior of the housing. Accordingly, in particular depending on the place of deployment of the electronics housing, the latter may under certain circumstances be exposed in operation to extreme fluctuations of humidity and temperature. As a result, a relatively high rise in pressure or a partial vacuum may occur in the interior of the housing, which may lead to damage to the electronics housing and to the subsequent uncontrolled penetration of moisture.

Solutions are in fact also known from practice, in which the electronics accommodated in the electronics housing are potted and the housing is completely impervious, or in which the electronics housing is equipped with a device for selective water management. However, a completely sealed housing entails the disadvantage that at an excessive internal pressure a housing wall will fail at a weak point, so that water can then penetrate through this into the interior space of the electronics housing. In addition, disadvantages may arise with this solution, in particular by virtue of the fact that additional costs arise as a result of the potting of the electronics, and the differing coefficients of thermal expansion between electronic components and potting material may result in a shearing of electronic components. In the case of a device for selective water management, the penetration of water through a macroscopic opening is prevented, thanks to an appropriate structural design (for example, in the form of a snorkel). But in this case the danger regularly exists that in the case of an unfavorable route the water nevertheless penetrates through the macroscopic—that is to say, comparatively large—housing aperture.

Against this background, a pressure-equalizing element in the form of an air-permeable but water-impermeable diaphragm is known, for example from DE 37 16 912 A1, which covers a housing aperture. Via the diaphragm, an exchange of air and water vapor is consequently made possible, but at the same time the penetration of water into the interior space of the electronics housing is prevented. Ordinarily, diaphragms of such a type are glued to an edge of the housing aperture or are fixed thereto by means of ultrasound.

From DE 10 2011 121 716 B3 it is known, furthermore, to mount a gas-permeable but liquid-impermeable diaphragm on a housing aperture by means of a collar contour surrounding the housing aperture. In this case, with the aid of the collar contour which is locally interrupted over its periphery, it is ensured that no water and/or particles of dirt can collect in the region of the diaphragm.

Nevertheless, in the case of electronics housings that provide for an equalization of pressure between the interior and the exterior of the housing via a diaphragm, a wetting of the diaphragm by water or surfactants or even a clogging of the diaphragm, in particular by dirt, regularly occurs, by virtue of which an equalization of pressure is considerably restricted or even completely prevented. Surfactants settling on the diaphragm have the result, for example, that the diaphragm becomes permeable to the water remaining on it, since the surface tension is lowered and hence the contact angle between water droplets and diaphragm becomes smaller. Water then penetrating into the electronics housing, or condensed water arising therein, results in damage to the electronics. Furthermore, by virtue of external influences such as temperature fluctuations and/or humidity, the at least partial detachment of the diaphragm may occur, and hence a loss of the impermeability to water in the region of the housing aperture.

SUMMARY

Proceeding from the aforementioned state of the art, an object underlying the invention is to make available an improved electronics housing that provides a possibility for the equalization of pressure between the interior and the exterior of the housing, in particular at an elevated internal pressure in the interior space of the electronics housing.

This object is achieved both with an electronics housing as described herein and with a production method as described herein.

An electronics housing according to the invention forms a pressure-equalizing element by virtue of a gas-permeable wall portion of the exterior wall, on which the exterior wall of the electronics housing exhibits a pore structure as a result of local foaming of the material from which the exterior wall has been produced. A pressure-equalizing element, with the aid of which an equalization of pressure between an interior space of the electronics housing and an exterior space surrounding the electronics housing is made possible, is consequently made available here by a wall portion consisting of open-cell or at least not completely closed-cell foam. Via the pore structure an equalization of pressure, and in particular the outflow of air from the interior space of the electronics housing to the outside, is made possible.

With the solution according to the invention, a pressure-equalizing element is consequently an integral part of the exterior wall of the electronics housing and is consequently integrated into the exterior wall. The production and mounting of a separate pressure-equalizing element—such as a diaphragm, for example—is consequently no longer necessary here.

The density of the gas-permeable wall portion is preferentially lower than the density of adjacent portions of the exterior wall of the electronics housing, in order to permit a gas permeability merely in a locally limited region of the exterior wall, and to enable an equalization of pressure. The majority of the exterior wall—that is to say, ordinarily more than 80%, preferentially more than 90%, of the exterior wall—has been produced from a non-foamed material, in order to continue to keep the electronics housing sufficiently robust and stiff. The lower density of the gas-permeable wall portion is consequently preferentially provided only in a locally greatly limited region of the exterior wall. Here, the density of the wall portion is then ordinarily lower than the density of all the remaining portions of the exterior wall.

In an embodiment, the gas-permeable wall portion exhibits a larger wall thickness in comparison with adjacent portions of the exterior wall. In particular, on average, a wall thickness of the gas-permeable wall portion may have been increased here in comparison with a wall thickness of adjacent portions. This increase in the wall thickness in this case by virtue of the local foaming of the material from which at least the exterior wall of the electronics housing has been produced may be accepted or may have been brought about selectively.

The gas-permeable wall portion may exhibit at least one region on which a wall thickness has been reduced in comparison with adjacent regions of the gas-permeable wall portion. The wall portion exhibiting a pore structure and forming the pressure-equalizing element consequently exhibits, in this practical variant, regions having differing wall thicknesses. In this connection, in the at least one region of reduced wall thickness, for example, an outer covering layer bounding the pore structure with respect to the exterior space, and/or an inner covering layer bounding the pore structure with respect to the interior space, may have been compressed in comparison with adjacent regions of the gas-permeable wall portion, at least partly removed, or at least partly selectively destroyed. In the case of the outer or inner covering layer, it is a question, for example, of a layer that exhibits no pore structure or only a pore structure of lower porosity. Accordingly, a comparatively large thickness of such a covering layer is not desirable for a reliable equalization of pressure and the greatest possible throughput of air through the gas-permeable wall portion. In a practical variant, against this background there is provision that within the scope of the production process such a covering layer was compressed, partly removed, or at least partly selectively destroyed, so that in at least one region of the gas-permeable wall portion the wall thickness thereof has been selectively reduced and the pore structure then extends here over more than 90% of the wall thickness of the gas-permeable wall portion.

In principle, it is preferred, incidentally, that a pore structure of the gas-permeable wall portion extends over almost the entire wall thickness, and an inner and/or outer covering layer and/or a lateral boundary layer is/are comparatively very thin and, in particular, make(s) up only a few pm, for example less than 5 µm. In the case of provision of a thin lateral boundary layer which protrudes beyond the housing aperture on the housing wall, an exchange of gas via this is guaranteed, so that a covering layer may also be comparatively thick, for example 100 µm thick, without the function of the pressure-equalizing element being impaired thereby.

In a variant, the foamed wall portion, which forms the pressure-equalizing element, protrudes on an outside facing toward the exterior space, and/or on an inside of the housing wall facing toward the interior space, so that an exchange of gas is possible over and beyond a boundary layer or a circumferential surface of the protruding part, defined by said boundary layer. The gas permeability and, in particular, the thickness of the respective (outer or inner) covering layer is consequently of less importance in this variant for an effective equalization of pressure.

In a practical variant, the gas-permeable wall portion exhibits hydrophobic properties. Preferentially, precisely the pore structure exhibits a certain hydrophobicity, in order to prevent the penetration of water into the pore structure. Such a hydrophobicity can be obtained, for example, by saturating the foamed wall portion in fluorine or silicone.

For simple, cost-effective production there may be provision that the exterior wall with the gas-permeable wall portion has been injection-molded or die-cast from a thermoplastic synthetic material or from a light metal such as, for example, aluminum or magnesium. For example, the exterior wall with the gas-permeable wall portion may have been produced from polypropylene (PP), polybutylene terephthalate (PBT) or polyamide (PA). In a further development based on this, use is made of PP, PBT or PA with a content of glass fibers greater than 10%, preferentially of about 30% or 40%—that is to say, for example, PP GF30, PP GF40, PBT GF30 or PA6 GF30.

In the case of the electronics housing, it is a question, for example, of an electronics housing for a drive device, in particular a drive device for a window-lifter drive. The electronics housing may in this case receive, for example, besides control electronics or parts thereof, also parts of a drive motor or of a transmission, coupled with said motor, of the drive device. Accordingly, in one embodiment the electronics housing may also form at least one part of a transmission housing for a window-lifter drive.

A further aspect of the invention is a method for producing an electronics housing having at least one pressure-equalizing element which enables an equalization of pressure between an interior space of the electronics housing and an exterior space surrounding the electronics housing. In accordance with the invention, in this case there is provision that at least one exterior wall of the electronics housing, which at least partly encloses the interior space, is produced by molding/casting and for the purpose of forming the pressure-equalizing element is locally foamed in one wall portion, so that this wall portion forms a gas-permeable pore structure.

One solution according to the invention includes, in particular, the production of a synthetic-material electronics housing in a thermoplastic foam injection-molding method (for example, the MuCell process) or the production of a light-metal electronics housing in an integral foam-molding method, in particular a high-pressure integral foam-molding method.

For the purpose of producing the gas-permeable wall portion forming the pressure-equalizing element, in a practical variant the temperature on the molded/cast exterior wall is locally increased. The local increase of the temperature—preferentially by means of a tool touching the molded/cast exterior wall—takes place, for example, during the cooling of the injection-molded or die-cast electronics housing and during the outgassing of a chemical blowing agent promoting the formation of foam in the injection-molding material or die-casting material from which the exterior wall is produced. Accordingly, for the foaming of the gas-permeable wall portion forming the pressure-equalizing element, use may have been made of a chemical blowing agent, for example, the outgassing of which is selectively influenced and controlled, in order to generate locally a gas-permeable wall portion for the formation of a pressure-equalizing element.

In a variant, the exterior wall of the electronics housing has been produced from an injection-molding material or die-casting material in such a manner that in the course of the cooling of the previously molded/cast exterior wall a gas dissolved in the melt and in a supercritical state outgasses. In this case, a (physical) foaming of the injection-molding material or die-casting material takes place as a result of a lowering of pressure—that is to say, a relief of tension—and consequently without a chemical reaction. As a result of local increase of the temperature on the wall portion forming the pressure-equalizing element, the melt continues to be kept selectively liquid in the boundary region, in order to obtain a foaming locally by virtue of the gas dissolved in the melt, and to form the pore structure. With the aid of the selectively promoted foaming of the wall portion, the density of the exterior wall of the electronics housing is consequently locally reduced, and a pore system is generated, via which an exchange of gas between interior space and exterior space becomes possible. Alternatively, a chemical blowing agent may have been employed for the purpose of foaming, in which case, here too, the melt continues to be kept selectively liquid in the boundary region, preferentially by local increase of the temperature on the wall portion forming the pressure-equalizing element.

By virtue of the foaming of the wall portion, the latter may have been locally thickened, so that the gas-permeable wall portion forming the pressure-equalizing element exhibits a larger wall thickness in comparison with adjacent portions of the exterior wall.

In a possible further development, the foamed wall portion exhibits an outer covering layer bounding the pore structure with respect to the exterior space, and/or an inner covering layer bounding the pore structure with respect to the interior space. A covering layer in this case exhibits, in each instance, no pore structure or only a pore structure of lower porosity.

For the purpose of forming the pressure-equalizing element, in this case the outer and/or inner covering layer has/have preferentially been processed, in particular compressed and/or at least partly removed or at least partly destroyed. With the aid of an appropriate processing of the outer and/or inner covering layer of the foamed wall portion, it is to be guaranteed that, at most, a very thin—that is to say, only a few μm thick—covering layer or no covering layer at all is present at the end of the production process. Accordingly, by virtue of a covering layer exhibiting no pore structure or only a pore structure of lower porosity, a possible throughput of air for pressure equalization via the gas-permeable wall portion is intended not to be impaired or not (excessively) restricted.

As a result of processing of the outer and/or inner covering layer, the gas-permeable wall portion and the pressure-equalizing element formed thereby at the end of the production process may exhibit at least one region in which a wall thickness has been reduced in comparison with adjacent regions of the gas-permeable wall portion. In the region of reduced wall thickness the foamed material of the gas-permeable wall portion has consequently been locally diminished and, where appropriate, provided with a depression toward the exterior space and/or toward the interior space, in order to make a pore structure of the pressure-equalizing element directly adjoin the exterior and/or interior space.

For the purpose of processing the inner and/or outer covering layer after the foaming of the wall portion, a punch, for example, may be utilized. With the aid of such a punch, not only a covering layer is locally destroyed but also the wall thickness of the gas-permeable wall portion exhibiting the pore structure is locally reduced. Of course, a destruction of the covering layer may also take place in a subsequent working step outside the injection-molding or die-casting procedure.

In order to avoid water penetrating into the interior space of the electronics housing via the pore structure of the pressure-equalizing element, said pore structure may be provided with hydrophobic properties. For this purpose, at least the part of an exterior wall of the electronics housing that exhibits the foamed wall portion is, for example, saturated in fluorine or silicone. This saturating in fluorine or silicone takes place in this case without closing the pores of the pore structure.

With a production method according to the invention, an electronics housing equipped in accordance with the invention can of course also be produced. Accordingly, advantages and disadvantages specified above and below also apply in this regard to practical variants of a production method according to the invention, and conversely.

BRIEF DESCRIPTION OF THE DRAWINGS

Further advantages and features of the invention will become clear in the course of the following elucidation of embodiments on the basis of the Figures.

FIGS. 3A to 3C in a detail, an exterior wall of the electronics housing in different phases during a production method according to the invention, in the course of which a part of the exterior wall is locally foamed, in order to form a pore structure and hence to integrate a pressure-equalizing element into the exterior wall.

DETAILED DESCRIPTION

Figure 1:
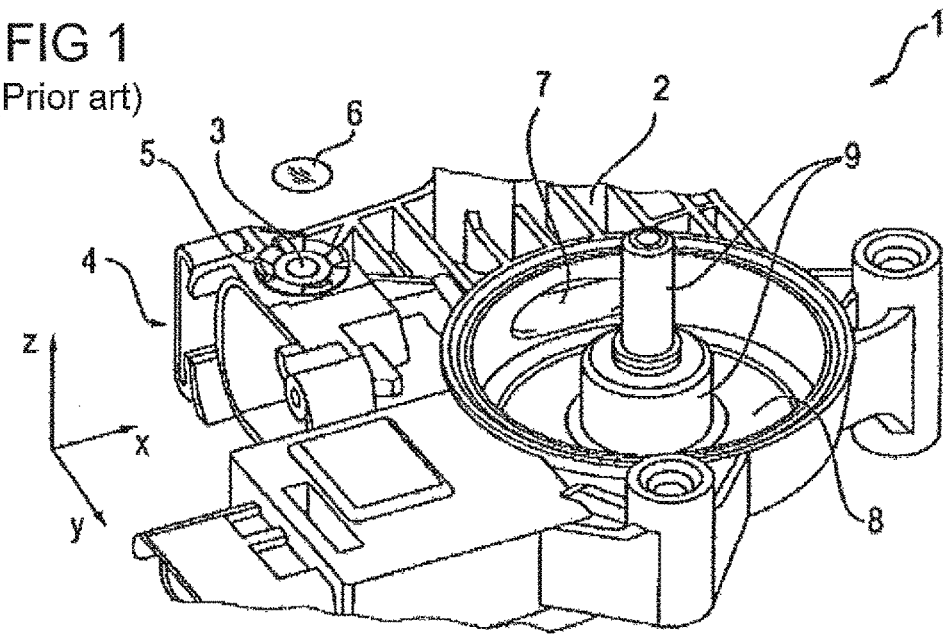
FIG. 1 in a detail and in perspective, a generic electronics housing from the state of the art.
Figure 2:
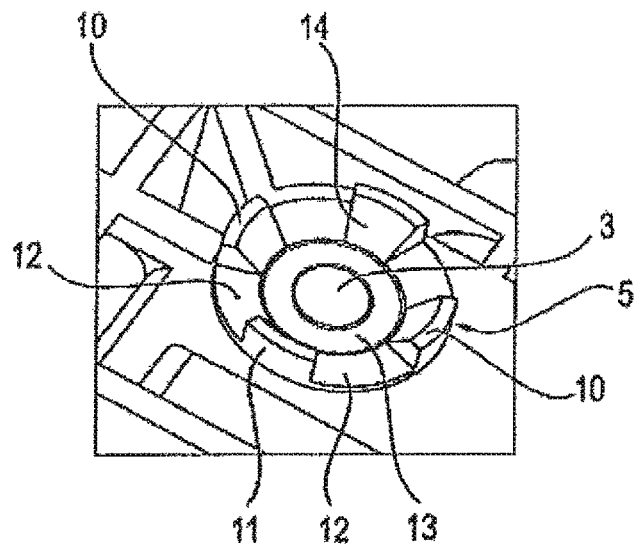
FIG. 2 an enlarged detail of the electronics housing shown in FIG. 1 with regard to a housing aperture which has been closed by a diaphragm so as to be impermeable to liquid.

FIGS. 1 and 2 show, in different views, a drive device 1, known from the state of the art, for an electromotive adjusting drive of a motor vehicle, for example for a window-lifter drive for the power-operated adjustment of a window pane of a vehicle. In this case, the drive device 1 exhibits, in particular, an electronics housing 2 with a housing aperture 3 in the region of a flange-like connecting point 4 for attaching a pole housing of an electric motor (not represented here). The electronics housing 2 serves in this case for the accommodation of electronic components for controlling the electric motor, and also for the accommodation of parts of a transmission of the drive device 1.

Via the housing aperture 3 of the electronics housing 2, an equalization of pressure between an interior space of the electronics housing and an exterior space of the electronics housing 2 is made possible. However, in order in this case to prevent moisture from getting into the interior space of the electronics housing 2, a diaphragm 6 has been provided on the housing aperture 3. This diaphragm 6 is gas-permeable and liquid-impermeable, and closes the housing aperture 3.

The diaphragm 6 in this case has been inserted into an annular collar contour 5 of the electronics housing 2, thereby covering up the housing aperture 3, and fixed in the region of this collar contour 5, preferentially by means of ultrasonic welding. The collar contour 5 surrounding the housing aperture 3 is repeatedly interrupted over its periphery, extends in the z-direction with respect to the Cartesian coordinate system represented, and consequently protrudes outside the electronics housing 2 via the housing aperture 3.

The housing aperture 3 in the present case is provided on a region of the electronics housing 2 that is spaced from an annular transmission chamber 8 of the electronics housing 2. In this annular transmission chamber 8 a worn wheel (not represented) is supported on an axis of rotation 9. A worm which is provided at the end of a motor shaft, extending in the x-direction, of the electric motor and which protrudes into the annular transmission chamber 8 via a housing-internal passage aperture 7 in the electronics housing 2 meshes with said worm wheel. Via the passage aperture 7, the worm driven by the motor shaft can consequently mesh with the worm wheel on the axis of rotation 9, in order to cause said worm wheel to rotate. Via the worm wheel on the axis of rotation 9, in turn a cable drum, not represented here, is driven which is likewise rotatably supported on the axis of rotation 9 and by means of which a traction means, for example in the form of a cable, is driven. Via the winding and unwinding of the traction means from the cable drum, at least one catch, for example, guided along a guide rail, is then adjusted, in order to open and close a window pane, connected to said catch, of the vehicle.

The collar contour 5 surrounding the housing aperture 3 in annular manner exhibits an interrupted ring surface 10 which is spaced from the housing aperture 3 in the z-direction. The ring surface 10 consequently lies in a plane that is located outside the electronics housing 2 in the z-direction above the plane in which the housing aperture 3 lies. The collar contour 5, designed in the manner of a jagged crown, forms several collar teeth and collar grooves 12 situated in between them. In this case, an annular support or bearing surface 3 is defined between the housing aperture 3 and the collar teeth 11. On this bearing surface 3 the diaphragm 6 rests and is fixed there.

Along its inner wall the collar contour 5 extends conically, inasmuch as the collar teeth 11 on the side facing toward the housing aperture 3 have each been formed with an obliquely extending inner tooth wall 14.

With the aid of the arrangement—known from the state of the art—of the diaphragm 6, an effective equalization of pressure is in fact guaranteed, and both the penetration of moisture into the interior of the electronics housing 2 and the collection of impounded water in the region of the diaphragm 6 are prevented.

However, in the case of the solution known from the state of the art it is disadvantageous that the diaphragm can come loose from the electronics housing 2. Furthermore, there is the danger of a contamination of the diaphragm, so that the latter becomes at least partly clogged and hence an equalization of pressure is rendered difficult or is even prohibited entirely.

In particular in this regard, the solution according to the invention provides a remedy, with respect to which a possible practical variant is shown in the sectional representations of FIGS. 3A to 3C. According to these representations, an exterior wall 20 of the electronics housing 2 is produced with a wall thickness d1, for example from a thermoplastic synthetic material or from a light metal in an injection-molding process. For the purpose of production, in particular a tool W (an injection-molding tool) having a channel K is provided.

After the injection molding of the electronics housing 2—and, in particular, of the exterior wall 20 thereof, which separates an interior space I from an exterior space A—said tool W is brought into abutment with respect to the exterior wall 20. With the aid of this tool W, the temperature of the exterior wall 20 is then selectively increased locally—that is to say, in a spatially limited region—in order, with the aid of this, to take advantage of the outgassing of a gas, which is dissolved in the melt and which is in a supercritical state, for a local foaming. In this connection the gas was previously dissolved in the injection-molding material utilized for the purpose of production.

As represented in FIG. 3B, in a region of the exterior wall 20 the gas dissolved in the melt outgasses and hereby foams a limited portion of the exterior wall 20. By virtue of the locally limited supply of heat via the tool W, in this case the melt is kept liquid right up to the edge and hence is kept foamable by the emergent gas. At the moment of volume enlargement, the gas then emerges from the forced solution in the melt. The gas dissolved in the melt consequently acts here as a physical blowing agent. Alternatively, the use of a chemical blowing agent is possible, which is released at the moment of volume enlargement.

Depending on the material from which the exterior wall 20 is produced, the respective foaming (with physical or chemical blowing agent) can take place fully as far as the inner and outer edge, so that an uninterrupted, not completely closed-cell pore structure is formed. This is possible, for example, in the case of a polymer material.

By virtue of the foaming, the exterior wall 20 is thickened in a limited wall portion 201 up to a wall thickness d2 (larger than d1) (cf. besides FIG. 3B, also FIG. 3C). By virtue of the foaming, this thickened wall portion 201 exhibits a gas-permeable pore structure and hence a lower density than the adjacent portions of the exterior wall 20. By virtue of a pore system generated in such a manner, an exchange of gas between the interior space I and the exterior space A over and beyond the exterior wall 20 is made possible.

In FIG. 3B, furthermore, a possible further development has been sketched, in which a thickening within the scope of the foaming process is permitted also on the inside of the exterior wall 20 facing toward the interior space I. In this case, the wall portion 201 forming the pressure-equalizing element 15 protrudes also on the inside at the end of the production process. By this, it is possible, where appropriate, to guarantee an exchange of gas (also) via the boundary layers or circumferential surfaces of the part protruding on the inside. The same applies, correspondingly, to the part of the foamed wall portion 201 protruding on the outside, as illustrated by the flow arrows represented in FIG. 3B.

The pore structure that has arisen by virtue of the local foaming of the exterior wall 20 is represented in FIG. 3C. Said pore structure constitutes a pressure-equalizing element 15 integrated into the exterior wall 20, via which an equalization of pressure is made possible, and via which pore structure air is able to escape out of the interior space I into the exterior space A in the event of a rise in pressure. The pore structure that is formed in this case forms, in the three-dimensional structure via passages in the pore walls, a connection between the inner and outer covering layers and/or lateral boundary layers. Consequently, in a sectional representation corresponding to FIG. 3C an uninterrupted connection is not necessarily evident. Alternatively, the pore walls produced by the foaming may be so thin that, in the case of a pressure-difference between interior and exterior of the housing, gas is able to flow through the pore structure for the purpose of equalizing the pressure.

In order to assist the possibility for equalization of pressure and the flowing of air through the pore structure of the gas-permeable wall portion 201, covering layers 150 and 151 of the foamed wall portion 201 are selectively destroyed in the practical variant represented. For this purpose, the thickened wall portion 201 is processed both from the interior-space side and from the exterior-space side by means of two punches ST1 and ST2, and the wall thickness of the foamed wall portion 201 in a central region is decreased on both sides. Accordingly, the wall portion 201 then exhibits, both toward the exterior space A and toward the interior space I, a centrally diminished region with smaller wall thickness d3 in comparison with adjacent regions. In this central region only a very thin—that is to say, a few μm thick—covering layer 150, 151 is then present in each instance. In a possible further development, the respective covering layer has been completely destroyed locally by the punches ST1 and ST2 going into the material, so that in the region of reduced wall thickness d3 only an incompletely closed-cell foam material is present.

The region of reduced wall thickness may be surrounded by a collar contour constituted by the region with larger wall thickness d2. By a suitable design of punch ST1, an interruption of the collar contour can be achieved on the side of the electronics housing 2 directed toward the exterior space A, and hence an accumulation of moisture in the region of the gas-permeable wall portion 201 can be avoided. For example, the formation of a collar contour 5 corresponding to FIG. 2 is provided for the purpose of avoiding an accumulation of water and dirt on the outer covering layer 150.

In order to prevent the penetration of water into the pore structure of the gas-permeable wall portion 201, in a following step of the method, not represented here, there is also provision to saturate the electronics housing 2, or at least the part of the exterior wall 20 that exhibits the foamed wall portion 201, in fluorine or silicone, without closing the pores. By this means, the foamed wall portion 201—and, in particular, the pore structure thereof—is then provided with hydrophobic properties.

The chemical blowing agent, the outgassing of which is selectively controlled with the aid of an increase in temperature in a spatially limited wall portion 201 of the exterior wall 20 and is promoted for the foaming of this wall portion 201, in order to form the pressure-equalizing element 15, is present in the form of supercritical fluid in the course of the cooling of the molded/cast electronics housing 2. In the case of the injection-molding material utilized in this case for the purpose of producing the exterior wall 20, it may be a question, for example, of a thermoplastic synthetic material, so that for the foaming of the gas-permeable wall portion 201 the chemical blowing agent outgasses from a polymer melt.

The exterior wall 20 with the gas-permeable, foamed wall portion 201 may, for example, have been produced from PP or PA with glass-fiber content, for example PP GF30 or PP GF40 or PA6 GF30, or PBT where appropriate also with glass-fiber content, for example PBT GF30.

By virtue of the variant according to the invention, no uninterrupted housing aperture, which is then closed by a gas-permeable and moisture-impermeable diaphragm, has to be provided on the exterior wall 20 for an equalization of pressure. Rather, an equalization of pressure is made possible via a pressure-equalizing element 15 integrated into the structure of the exterior wall 20, which element is formed within the scope of the injection-molding process for the forming of the exterior wall 20 by a selectively locally influenced outgassing of a chemical blowing agent. With the aid of this, the mechanical stability of the exterior wall 20 is improved in comparison with a solution having a housing aperture, and the attachment of a separately produced diaphragm is obsolete.

LIST OF REFERENCE SYMBOLS 1 drive device
10 ring surface
11 collar tooth
12 collar groove
13 bearing surface
14 inner tooth wall
15 pressure-equalizing element
K channel
150, 151 covering layer (with locally reduced wall thickness)
201 gas-permeable wall portion with pore structure
2 electronics housing
20 exterior wall
3 housing aperture
4 connecting point
5 collar contour
6 diaphragm
7 passage aperture
8 transmission chamber
9 axis of rotation
A exterior space
d1, d2, d3 wall thickness
ST1, ST2 punch
W tool
I interior space

The invention claimed is:

1. An electronics housing for the accommodation of at least one electronic component in an interior space defined by the electronics housing and enclosed at least partly by an exterior wall of the electronics housing, said electronics housing exhibiting at least one pressure-equalizing element which enables an equalization of pressure between the interior space and an exterior space surrounding the electronics housing, wherein the pressure-equalizing element is constituted by a gas-permeable wall portion of the exterior wall, on which the exterior wall exhibits a pore structure as a result of local foaming of the material from which the exterior wall has been produced.

2. The electronics housing according to claim 1, wherein the density of the gas-permeable wall portion is lower than the density of adjacent portions of the exterior wall of the electronics housing.

3. The electronics housing according to claim 1, wherein the gas-permeable wall portion exhibits a larger wall thickness in comparison with adjacent portions of the exterior wall.

4. The electronics housing according to claim 1, wherein the gas-permeable wall portion exhibits at least one region in which a wall thickness is reduced in comparison with adjacent regions of the gas-permeable wall portion.

5. The electronics housing according to claim 4, wherein in the at least one region of reduced wall thickness an outer covering layer bounding the pore structure with respect to the exterior space, and/or an inner covering layer bounding the pore structure with respect to the interior space, has/have been compressed in comparison with adjacent regions of the gas-permeable wall portion, at least partly removed, or at least partly selectively destroyed.

6. The electronics housing according to claim 1, wherein the gas-permeable wall portion exhibits hydrophobic properties.

7. The electronics housing according to claim 1, wherein the exterior wall with the gas-permeable wall portion has been injection-molded from a thermoplastic or thermosetting synthetic material or has been injection-molded or die-cast from a light metal.

8. The electronics housing according to claim 7, wherein the exterior wall with the gas-permeable wall portion has been produced from polypropylene or polybutylene terephthalate.

9. A method for producing an electronics housing with at least one pressure-equalizing element which enables an equalization of pressure between an interior space of the electronics housing and an exterior space surrounding the electronics housing, wherein at least one exterior wall of the electronics housing, which at least partly encloses the interior space, is produced by molding/casting and for the purpose of forming the pressure-equalizing element is locally foamed in one wall portion, so that this wall portion forms a gas-permeable pore structure.

10. The method according to claim 9, wherein for the purpose of producing the gas-permeable wall portion forming the pressure-equalizing element the temperature on the molded/cast exterior wall is locally increased.

11. The method according to claim 9, wherein a chemical blowing agent is used for the foaming of the gas-permeable wall portion forming the pressure-equalizing element.

12. The method according to claim 11, wherein the exterior wall of the electronics housing is produced from an injection-molding material or die-casting material in such a manner that in the course of the cooling of the previously molded/cast exterior wall a blowing agent outgasses, in order locally to foam the wall portion forming the pressure-equalizing element.

13. The method according to claim 10, wherein the exterior wall of the electronics housing is produced from an injection-molding material or die-casting material in such a manner that in the course of the cooling of the previously molded/cast exterior wall a blowing agent outgasses, in order locally to foam the wall portion forming the pressure-equalizing element, and as a result of the local increase of the temperature the outgassing of the supercritical fluid is selectively promoted on a wall portion of the exterior wall and, with the aid of this, the wall portion is foamed, in order to form the pore structure.

14. The method according to claim 9, wherein as a result of the foaming of the wall portion the latter is locally thickened and hence exhibits a larger wall thickness in comparison with adjacent portions of the exterior wall.

15. The method according to claim 9, wherein the foamed wall portion exhibits an outer covering layer bounding the pore structure with respect to the exterior space, and/or an inner covering layer bounding the pore structure with respect to the interior space, which exhibit(s) no pore structure or only a pore structure of lower porosity, and for the purpose of forming the pressure-equalizing element the outer and/or inner covering layer is/are processed, in particular compressed and/or at least partly removed or at least partly destroyed.

16. The method according to 15, wherein a punch is utilized for the purpose of processing the inner and/or outer covering layer after the foaming of the wall portion.

17. The method according to claim 9, wherein the foamed wall portion is saturated in fluorine or silicone, so that the foamed wall portion exhibits hydrophobic properties.

* * * * *